(12) United States Patent
Huemoeller et al.

(10) Patent No.: US 8,432,022 B1
(45) Date of Patent: Apr. 30, 2013

(54) SHIELDED EMBEDDED ELECTRONIC COMPONENT SUBSTRATE FABRICATION METHOD AND STRUCTURE

(75) Inventors: Ronald Patrick Huemoeller, Gilbert, AZ (US); Brett Dunlap, Queen Creek, AZ (US); David Jon Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 636 days.

(21) Appl. No.: 12/569,300

(22) Filed: Sep. 29, 2009

(51) Int. Cl.
*H01L 23/552* (2006.01)
*H01L 21/70* (2006.01)

(52) U.S. Cl.
USPC ............. 257/659; 257/508; 257/E21.001; 257/728; 257/704; 257/660

(58) Field of Classification Search ........... 257/E33.058, 257/508, 659, 660, 678, 728, 506, 704, E21.001
See application file for complete search history.

(56) References Cited

U.S. PATENT DOCUMENTS

| | | | |
|---|---|---|---|
| 5,151,769 A * | 9/1992 | Immorlica et al. ............ | 257/659 |
| 6,441,498 B1 | 8/2002 | Song | |
| 6,507,119 B2 | 1/2003 | Huang et al. | |
| 6,682,957 B2 | 1/2004 | Song | |
| 6,847,115 B2 * | 1/2005 | Crane et al. .................... | 257/728 |
| 6,909,054 B2 | 6/2005 | Sakamoto et al. | |
| 7,045,391 B2 * | 5/2006 | Lin ............................... | 438/109 |
| 7,154,189 B2 | 12/2006 | Maeda et al. | |
| 7,269,899 B2 * | 9/2007 | Brist et al. ...................... | 29/853 |
| 7,338,892 B2 | 3/2008 | Wang et al. | |
| 7,633,765 B1 * | 12/2009 | Scanlan et al. ................ | 361/760 |
| 8,053,681 B2 * | 11/2011 | Jung et al. ...................... | 174/264 |
| 2002/0117743 A1 | 8/2002 | Nakatani et al. | |
| 2006/0076671 A1 | 4/2006 | Kariya et al. | |
| 2006/0145328 A1 | 7/2006 | Hsu | |
| 2007/0056766 A1 | 3/2007 | Sunohara | |
| 2007/0084628 A1 | 4/2007 | Chang et al. | |
| 2007/0093066 A1 * | 4/2007 | Baskaran et al. ............. | 438/700 |
| 2007/0119617 A1 | 5/2007 | Hayashi et al. | |
| 2007/0284711 A1 | 12/2007 | Lee et al. | |
| 2008/0007927 A1 * | 1/2008 | Ito et al. ........................ | 361/764 |
| 2009/0085190 A1 | 4/2009 | Simon et al. | |

FOREIGN PATENT DOCUMENTS

JP 11-174174 7/1999

OTHER PUBLICATIONS

Jung et al., "Semiconductor Device and Fabricating Method Thereof", U.S. Appl. No. 12/204,692, filed Sep. 4, 2008.

* cited by examiner

*Primary Examiner* — Colleen Matthews
*Assistant Examiner* — Galina Yushina
(74) *Attorney, Agent, or Firm* — McKay and Hodgson, LLP; Serge J. Hodgson

(57) ABSTRACT

A shielded embedded electronic component substrate includes a core dielectric layer having a die opening. An electrically conductive die shield lines the die opening. An electronic component is mounted within the die opening and to the die shield, where the die shield shields the electronic component. By mounting the electronic component within the die opening, the shielded embedded electronic component substrate is made relatively thin. Further, heat generated by the electronic component is dissipated to the die shield and to the ambient environment. Accordingly, the shielded embedded electronic component substrate is well suited for use when the electronic component generates a significant amount of heat, e.g., in high power applications.

16 Claims, 10 Drawing Sheets

SHIELDED EMBEDDED ELECTRONIC COMPONENT SUBSTRATE FABRICATION METHOD AND STRUCTURE

BACKGROUND OF THE INVENTION

1. Field of the Invention

The present invention relates generally to methods of fabricating electronic component substrates and the resulting structures. More particularly, the present invention relates to methods of fabricating a shielded embedded electronic component substrate and the resulting structures.

2. Description of the Related Art

To reduce overall package thickness, an electronic component is placed inside of an opening in a substrate. By placing the electronic component inside of the opening in the substrate, the resulting electronic component package is thin relative to an electronic component package having the electronic component mounted on top of the substrate.

Unfortunately, mounting the electronic component inside of the substrate causes electromagnetic interference between the electronic component and the substrate circuit patterns due to the close proximity of the electronic component to the substrate circuit patterns.

Further, as the electronic component is embedded inside of the substrate, which is typically a poor thermal conductor, heat transfer from the electronic component is problematic.

SUMMARY OF THE INVENTION

A shielded embedded electronic component substrate includes a core dielectric layer having a die opening. An electrically conductive die shield lines the die opening. An electronic component is mounted within the die opening and to the die shield, where the die shield shields the electronic component. By mounting the electronic component within the die opening, the shielded embedded electronic component substrate is made relatively thin. Further, heat generated by the electronic component is dissipated to the die shield and to the ambient environment. Accordingly, the shielded embedded electronic component substrate is well suited for use when the electronic component generates a significant amount of heat, e.g., in high power applications.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
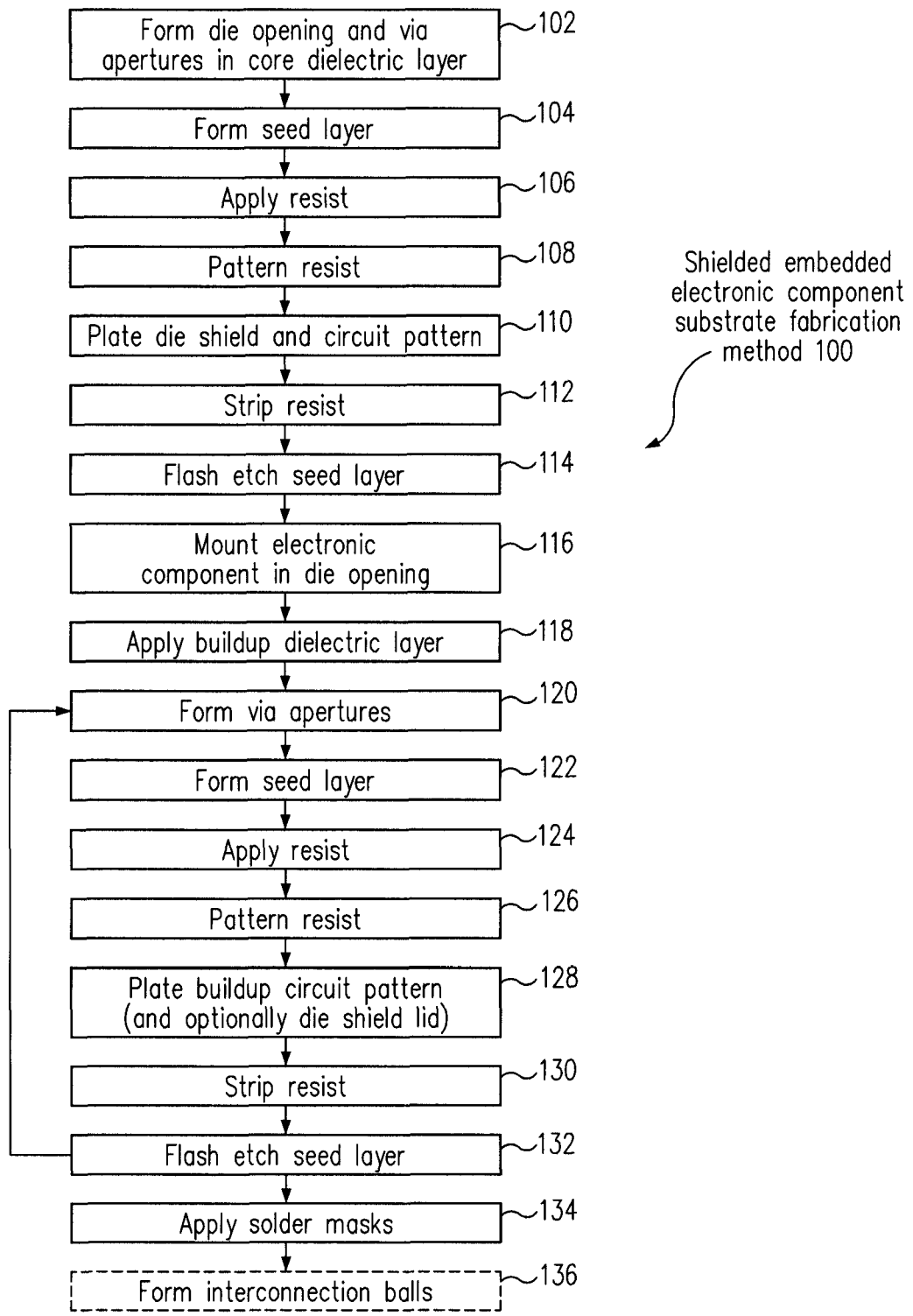
FIG. 1 is a shielded embedded electronic component substrate fabrication method in accordance with one embodiment.
Figure 2:
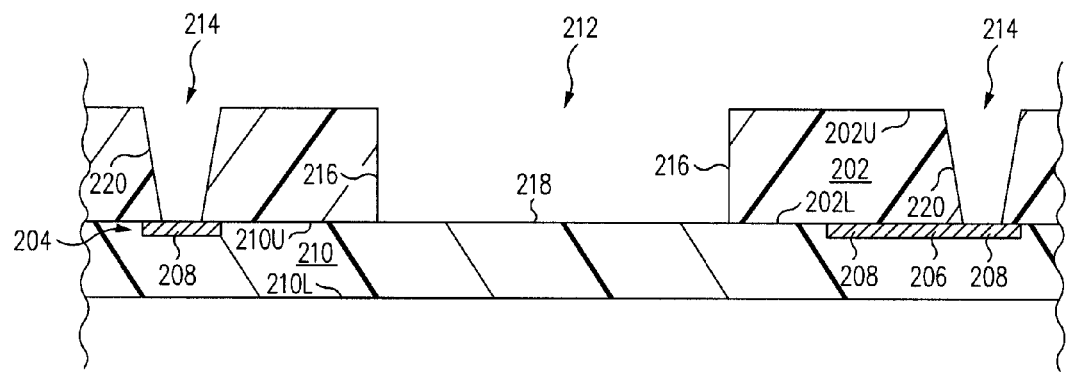
FIG. 2 is a cross-sectional view of a shielded embedded electronic component substrate during fabrication in accordance with one embodiment.

FIG. 1 is a shielded embedded electronic component substrate fabrication method 100 in accordance with one embodiment. FIG. 2 is a cross-sectional view of a shielded embedded electronic component substrate 200 during fabrication in accordance with one embodiment.

Referring now to FIGS. 1 and 2 together, shielded embedded electronic component substrate 200 includes a core dielectric layer 202, e.g., prepreg, film and/or laminate. Core dielectric layer 202 includes an upper, e.g., first, surface 202U and a lower, e.g., second, surface 202L.

Formed on lower surface 202L of core dielectric layer 202 is a lower, e.g., first, circuit pattern 204. Lower circuit pattern 204 is formed of an electrically conductive material such as copper. Lower circuit pattern 204 includes electrically conductive traces 206 and electrically conductive lands 208 in this embodiment.

Shielded embedded electronic component substrate 200 further includes a lower, e.g., first, buildup dielectric layer 210, e.g., prepreg or film. Lower buildup dielectric layer 210 includes an upper, e.g., first, surface 210U and a lower, e.g., second, surface 210L.

Upper surface 210U of lower buildup dielectric layer 210 is attached to lower surface 202L of core dielectric layer 202 and covers lower circuit pattern 204. In accordance with this embodiment, lower circuit pattern 204 is embedded into upper surface 210U of lower buildup dielectric layer 210. However, in another embodiment, circuit pattern 204 is embedded within lower surface 202L of core dielectric layer 202. In yet another embodiment, circuit pattern 204 is between lower surface 202L of core dielectric layer 202 and upper surface 210U of lower buildup dielectric layer 210.

In a form die opening and via apertures in core dielectric layer operation 102, a die opening 212 and via apertures 214 are formed within core dielectric layer 202. Die opening 212 and via apertures 214 are formed using any one of a number of techniques, e.g., using laser ablation or selective etching.

In accordance with this embodiment, die opening 212 extends entirely through core dielectric layer 202 and between upper surface 202U and lower surface 202L. More particularly, die opening 212 is defined by die opening sidewalls 216 of core dielectric layer 202 and a die opening base 218 of lower buildup dielectric layer 210.

Die opening sidewalls 216 extend perpendicularly between upper surface 202U and lower surface 202L of core dielectric layer 202. Die opening base 218 is the region of upper surface 210U of lower buildup dielectric layer 210 exposed through die opening 212. Die opening base 218 is perpendicular to die opening sidewalls 216.

Although the terms perpendicular, parallel, and similar terms are used herein, in light of this disclosure, those of skill in the art will understand that the elements may not be exactly perpendicular and parallel, but only substantially perpendicular and parallel to within excepted manufacturing tolerances.

Via apertures 214 also extend entirely through core dielectric layer 202 and between upper surface 202U and lower surface 202L. More particularly, via apertures 214 are defined by via aperture sidewalls 220 of core dielectric layer 202.

Via apertures 214 expose lower circuit pattern 204, e.g., lands 208 thereof. More particularly, via apertures 214 extend through core dielectric layer 202 exposing lands 208 of lower circuit pattern 204.

Figure 3:
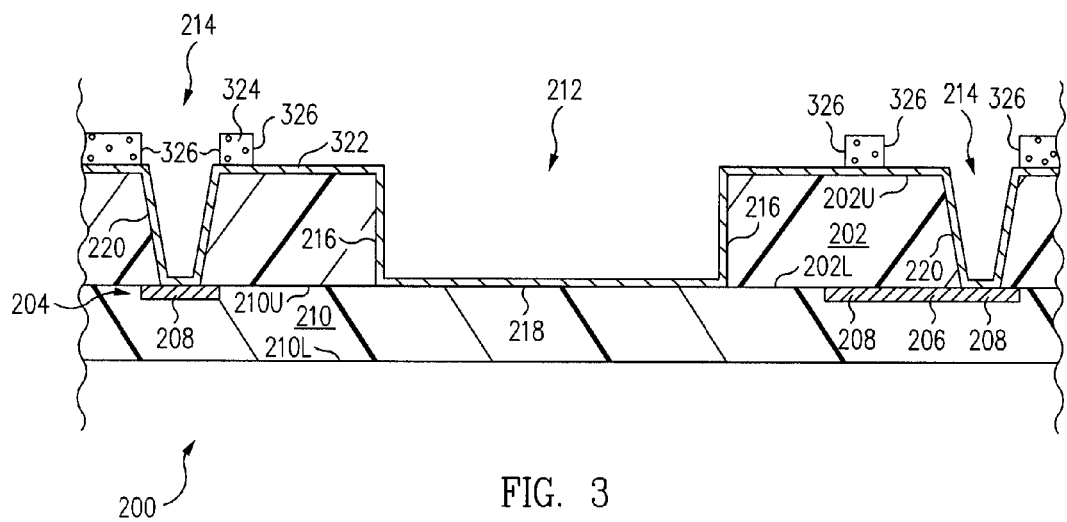
FIGS. 3, 4, 5, 6, 7, 8, 9 are cross-sectional views of the shielded embedded electronic component substrate of FIG. 2 at further stages during fabrication in accordance with various embodiments.

FIG. 3 is a cross-sectional view of shielded embedded electronic component substrate 200 of FIG. 2 at a further stage during fabrication in accordance with one embodiment. Referring now to FIGS. 1 and 3 together, from form die opening and via apertures in core dielectric layer operation 102, flow moves to a form seed layer operation 104. In form seed layer operation 104, a seed layer 322 is blanket formed.

Seed layer 322 is formed directly on and covers upper surface 202U of core dielectric layer 202. Further, seed layer 322 is formed within and lines die opening 212 and via apertures 214. Seed layer 322 is formed on and covers die opening sidewalls 216, die opening base 218, via aperture sidewalls 220, and lands 208 exposed through via apertures 214. Accordingly, seed layer 322 is formed on and is electrically connected to lands 208. In one embodiment, seed layer 322 is formed by plating or sputtering an electrically conductive material such as copper.

From form seed layer operation 104, flow moves to an apply resist operation 106. In apply resist operation 106, a dielectric resist 324 is applied. Resist 324, e.g., a photoresist, entirely covers seed layer 322.

From apply resist operation 106, flow moves to a pattern resist operation 108. In pattern resist operation 108, resist 324 is patterned to form a circuit pattern and die shield artifact 326 therein. Circuit pattern and die shield artifact 326 is a patterned opening extending entirely through resist 324. In one embodiment, circuit pattern and die shield artifact 326 is a positive image of the circuit pattern and die shield to be formed as discussed further below.

More particularly, circuit pattern and die shield artifact 326 exposes via apertures 214 and lands 208 upon which electrically conductive vias will be formed as discussed further below. Further, circuit pattern and die shield artifact 326 exposes the portion of upper surface 202U of core dielectric layer 202 extending from via apertures 214 upon which electrically conductive traces and lands will be formed as discussed further below.

Further, circuit pattern and die shield artifact 326 exposes die opening 212 and the portion of upper surface 202U of core dielectric layer 202 extending from die opening 212 upon which an electrically conductive die shield will be formed as discussed further below. Although various structures are described herein as being exposed through artifacts formed in resists, it is to be understood that the structures may be covered by a seed layer and so are only indirectly exposed.

Figure 4:
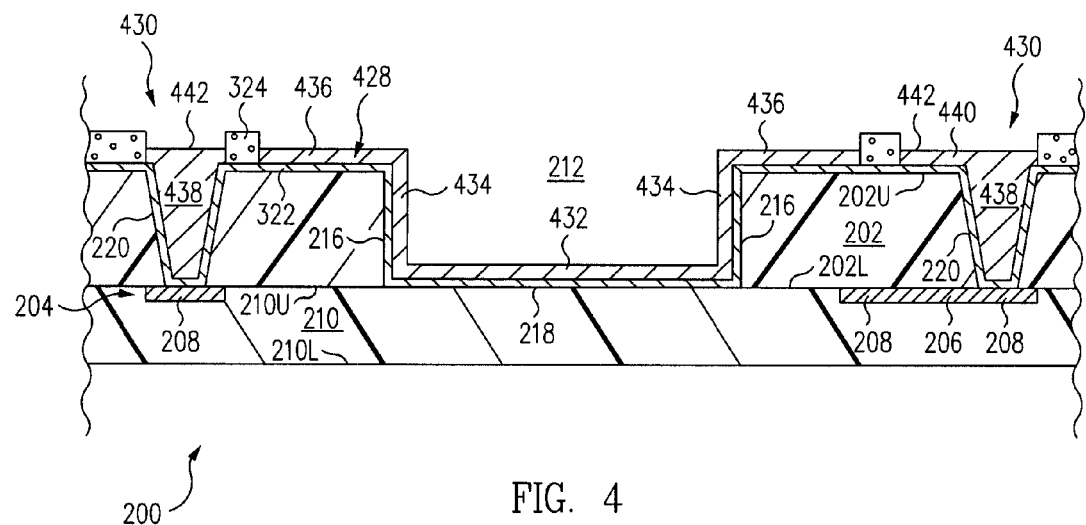

FIG. 4 is a cross-sectional view of shielded embedded electronic component substrate 200 of FIG. 3 at a further stage during fabrication in accordance with one embodiment. Referring now to FIGS. 1, 3 and 4 together, from pattern resist operation 108, flow moves to a plate die shield and circuit pattern operation 110. In plate die shield and circuit pattern operation 110, an electrically conductive die shield 428 and an electrically conductive upper circuit pattern 430 are plated in circuit pattern and die shield artifact 326 using seed layer 322 as a plating electrode. Illustratively, die shield 428 and upper circuit pattern 430 are a single layer of copper although can be formed of other electrically conductive materials, e.g., can be formed of two or more layers of metal.

Die shield 428 lines die opening 212 and extends from die opening 212 on upper surface 202U of core dielectric layer 202. More particularly, die shield 428 includes a die shield base 432 on die opening base 218, i.e., on the portion of upper surface 210U of lower buildup dielectric layer 210 exposed through die opening 212. Further, die shield 428 includes die shield sidewalls 434 on die opening sidewalls 216 of core dielectric layer 202. Further, die shield 428 includes a die shield flange 436 on upper surface 202U of core dielectric layer 202. Die shield flange 436 extends outwards on upper surface 202U of core dielectric layer 202 from die shield sidewalls 434.

Further, upper circuit pattern 430 includes electrically conductive core dielectric layer vias 438 formed within via apertures 214 and electrically connected to lands 208. Upper circuit pattern 430 further includes traces 440 and/or lands 442 on upper surface 202U of core dielectric layer 202.

Traces 440 are electrically connected to and extend from core dielectric layer vias 438. In one embodiment, the upper surface of a core dielectric layer via 438 forms a land 442. In another embodiment, a land 442 is formed on upper surface 202U of core dielectric layer 202 spaced apart from core dielectric layer vias 438 and electrically connected to core dielectric layer vias 438 by traces 440.

Although circuit patterns are described herein as including various features, e.g., vias, traces, and lands, in light of this disclosure, those of skill in the art will understand that circuit patterns can be formed with different features depending upon the particular signal routing desired.

Further, although various structures are described herein as being formed directly on dielectric layers, it is to be understood that the structures may be formed on seed layers and so are only indirectly formed on the dielectric layers.

Figure 5:
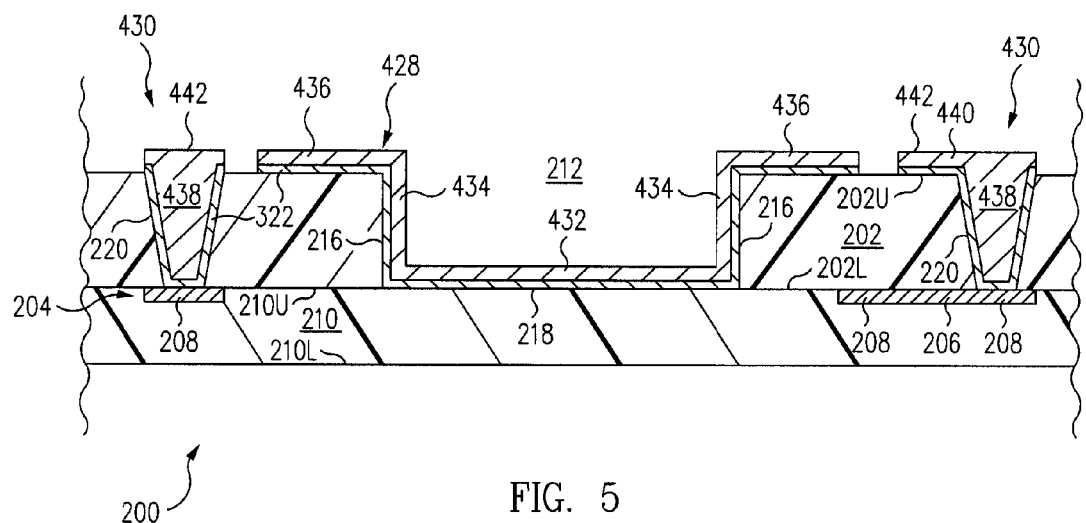

FIG. 5 is a cross-sectional view of shielded embedded electronic component substrate 200 of FIG. 4 at a further stage during fabrication in accordance with one embodiment. Referring now to FIGS. 1, 4 and 5 together, from plate die shield and circuit pattern operation 110, flow moves to a strip resist operation 112. In strip resist operation 112, resist 324 is stripped, i.e., removed. Accordingly, after removal of resist 324, an exposed portion, sometimes called an un-plated portion, of seed layer 322 is exposed.

From strip resist operation 112, flow moves to a flash etch seed layer operation 114. In flash etch seed layer operation 114, the exposed portion of seed layer 322 is removed by etching. Portions of seed layer 322 remain underneath die shield 428 and upper circuit pattern 430.

Figure 6:
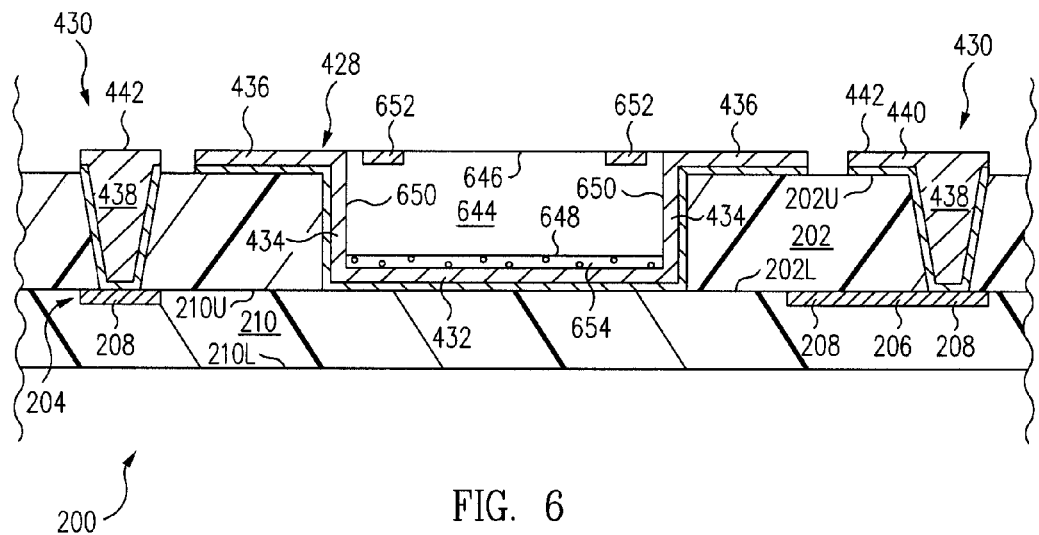

FIG. 6 is a cross-sectional view of shielded embedded electronic component substrate 200 of FIG. 5 at a further stage during fabrication in accordance with one embodiment. Referring now to FIGS. 1, 5 and 6 together, from flash etch seed layer operation 114, flow moves to a mount electronic component in die opening operation 116. In mount electronic component in die opening operation 116, an electronic component 644 is mounted within die opening 212 and to die shield 428.

In accordance with this embodiment, electronic component 644 is an active component, e.g., an integrated circuit chip. Electronic component 644 includes an active surface 646, an opposite inactive surface 648, and sides 650 extending perpendicularly between active surface 646 and inactive surface 648. Further, electronic component 644 includes bond pads 652 on active surface 646.

Although an active component as electronic component 644 is set forth herein and illustrated in the figures, in other embodiments, electronic component 644 is a passive component, e.g., a resistor, capacitor, or inductor. In one embodiment, electronic component 644 is called an integrated passive device (IPD).

In one embodiment, inactive surface 648 is mounted to die shield base 432 by an adhesive 654. In one embodiment, adhesive 654 is a dielectric adhesive. In another embodiment, adhesive 654 is an electrically conductive adhesive, e.g., a silver filled adhesive, thus electrically connecting inactive surface 648 to die shield base 432. In yet another embodiment, adhesive 654 has a high thermal conductivity enhancing heat transfer from inactive surface 648 to die shield base 432.

In accordance with this embodiment, active surface 646 is substantially parallel to and coplanar with die shield flange 436. However, in other embodiments, active surface 646 is recessed below or protrudes above die shield flange 436. Further, a space or gap may exist between sides 650 of electronic component 644 and die shield sidewalls 434 of die shield 428.

By mounting electronic component 644 within die opening 212, shielded embedded electronic component substrate 200 is made relatively thin.

Figure 7:
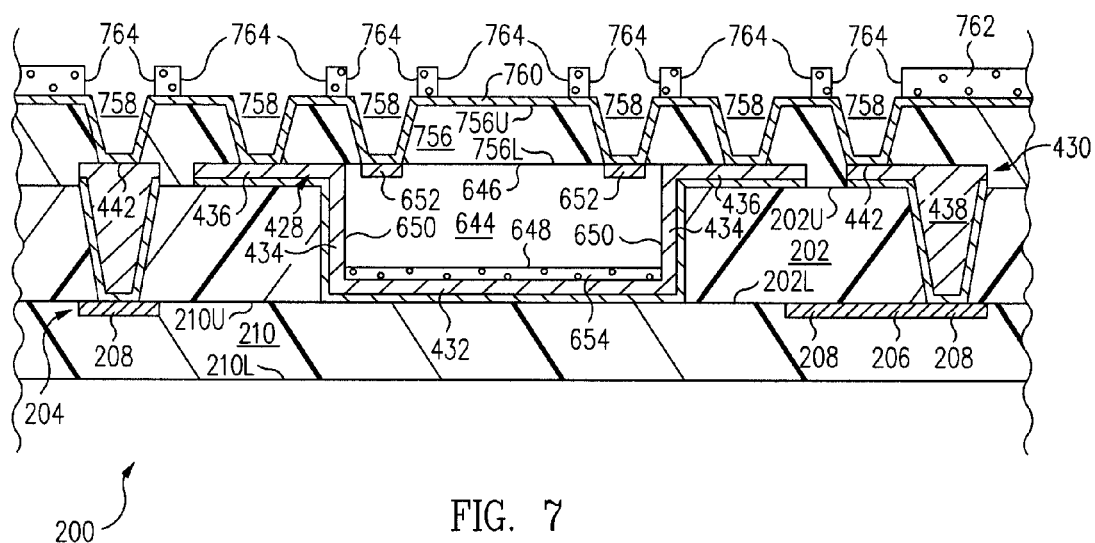

FIG. 7 is a cross-sectional view of shielded embedded electronic component substrate 200 of FIG. 6 at a further stage during fabrication in accordance with one embodiment. Referring now to FIGS. 1 and 7 together, from mount electronic component in die opening operation 116, flow moves to an apply buildup dielectric layer operation 118. In apply buildup dielectric layer operation 118, an upper buildup dielectric layer 756, e.g., prepreg or film, is applied. Upper buildup dielectric layer 756 includes a lower, e.g., first, surface 756L and an upper, e.g., second, surface 756U.

Lower surface 756L of upper buildup dielectric layer 756 is applied to upper circuit pattern 430, active surface 646 of electronic component 644, die shield flange 436 of die shield 428, and the exposed portion of upper surface 202U of core dielectric layer 202. Further, upper buildup dielectric layer 756 fills any space or gap between sides 650 of electronic component 644 and die shield sidewalls 434 of die shield 428. Upper buildup dielectric layer 756 is a dielectric material, e.g., is polyimide although other dielectric materials are used in other embodiments.

From apply buildup dielectric layer operation 118, flow moves to a form via apertures operation 120. In form via apertures operation 120, upper buildup dielectric layer 756 is patterned to form via apertures 758 therein. In accordance with this embodiment, via apertures 758 extend entirely through upper buildup dielectric layer 756 and expose lands 442 of upper circuit pattern 430 and die shield flange 436 of die shield 428. Further, via apertures 758 expose bond pads 652 of electronic component 644.

From form via apertures operation 120, flow moves to a form seed layer operation 122. In form seed layer operation 122, a seed layer 760 is blanket formed. Seed layer 760 is formed directly on and covers upper buildup dielectric layer 756. Further, seed layer 760 is formed within and lines via apertures 758 in upper buildup dielectric layer 756. Further still, seed layer 760 is on and is electrically connected to lands 442 of upper circuit pattern 430, die shield flange 436 of die shield 428, and bond pads 652 of electronic component 644. In one embodiment, seed layer 760 is formed by plating or sputtering an electrically conductive material such as copper.

From form seed layer operation 122, flow moves to an apply resist operation 124. In apply resist operation 124, a dielectric resist 762 is applied. Resist 762, e.g., a photoresist, entirely covers seed layer 760.

From apply resist operation 124, flow moves to a pattern resist operation 126. In pattern resist operation 126, resist 762 is patterned to form a buildup circuit pattern and die shield lid artifact 764 therein. Buildup circuit pattern and die shield lid artifact 764 is a patterned opening extending entirely through resist 762 and exposing a positive image of the buildup circuit pattern and, optionally, die shield lid to be formed.

Figure 8:
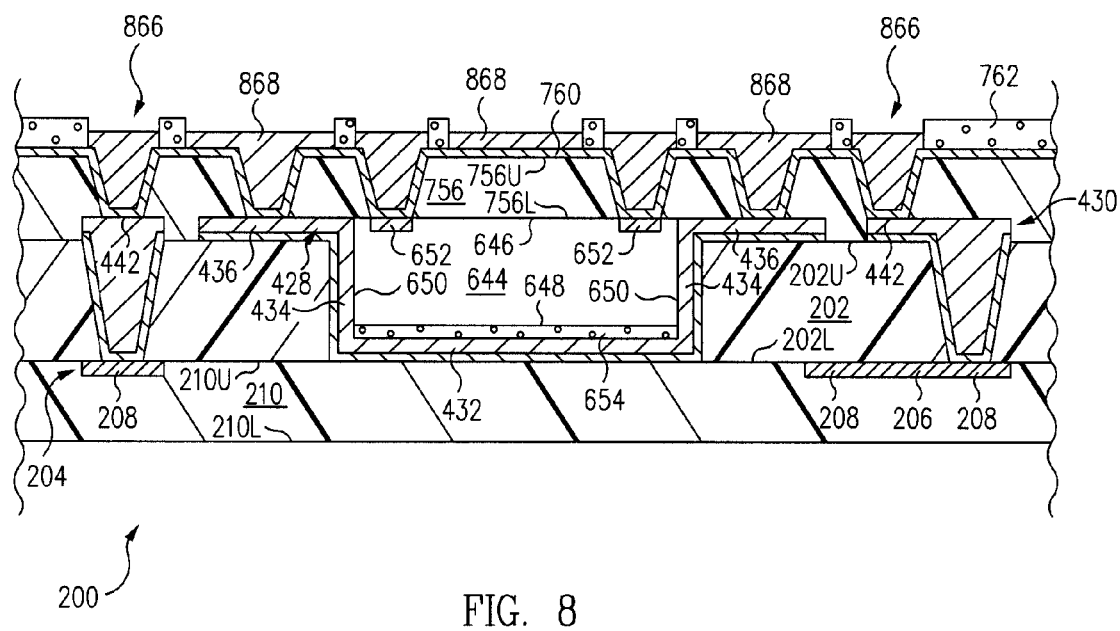

FIG. 8 is a cross-sectional view of shielded embedded electronic component substrate 200 of FIG. 7 at a further stage during fabrication in accordance with one embodiment. Referring now to FIGS. 1, 7 and 8 together, from pattern resist operation 126, flow moves to a plate buildup circuit pattern (and optionally die shield lid) operation 128. In plate buildup circuit pattern (and optionally die shield lid) operation 128, an electrically conductive upper buildup circuit pattern 866 and, optionally, die shield lid 868 are plated in buildup circuit pattern and die shield lid artifact 764 using seed layer 760 as a plating electrode. Illustratively, upper buildup circuit pattern 866 and die shield lid 868 are a single layer of copper although can be formed of other electrically conductive materials, e.g., can be formed of two or more layers of metal such as gold and nickel. Formation of die shield lid 868 is optional, and in one embodiment, die shield lid 868 is not formed.

Figure 9:
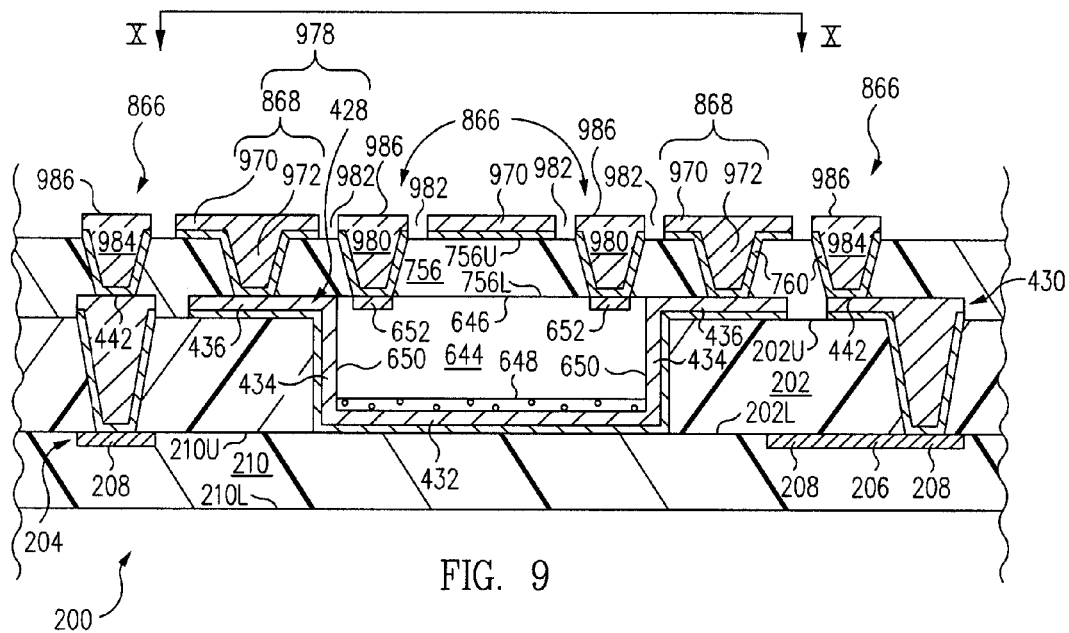
Figure 10:
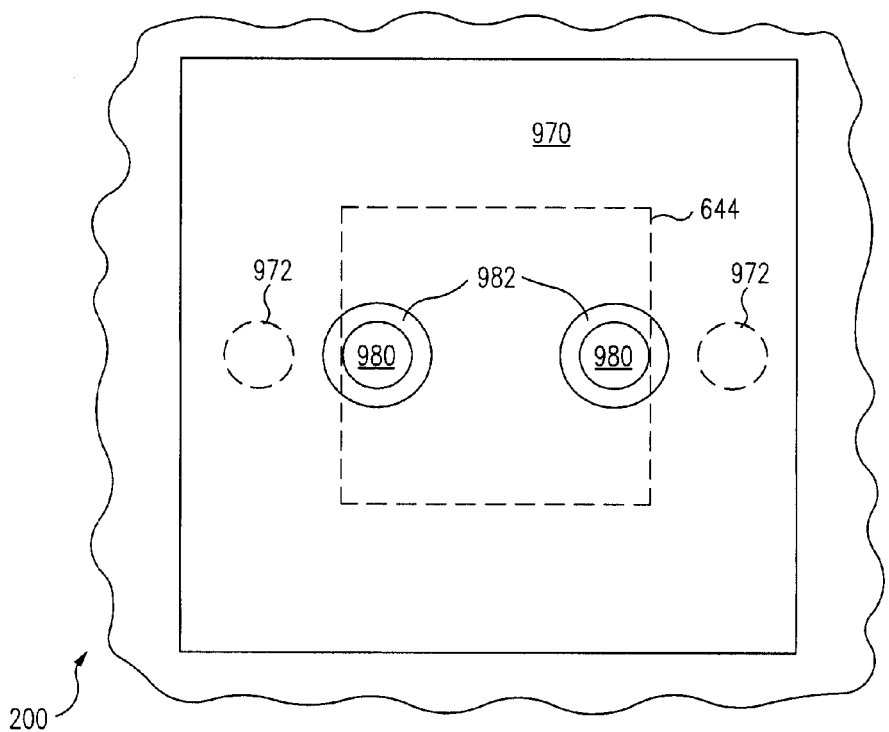
FIG. 10 is a top plan view of the shielded embedded electronic component substrate along the line X-X of FIG. 9 in accordance with one embodiment.

FIG. 9 is a cross-sectional view of shielded embedded electronic component substrate 200 of FIG. 8 at a further stage during fabrication in accordance with one embodiment. FIG. 10 is a top plan view of shielded embedded electronic component substrate 200 along the line X-X of FIG. 9 in accordance with one embodiment. Referring now to FIGS. 1, 8, 9, and 10 together, from plate buildup circuit pattern (and optionally die shield lid) operation 128, flow moves to a strip resist operation 130. In strip resist operation 130, resist 762 is stripped, i.e., removed. Accordingly, after removal of resist 762, an exposed portion, sometimes called an un-plated portion, of seed layer 760 is exposed.

From strip resist operation 130, flow moves to a flash etch seed layer operation 132. In flash etch seed layer operation 132, the exposed portion of seed layer 760 is removed by flash etching. Portions of seed layer 760 remain underneath upper buildup circuit pattern 866 and die shield lid 868.

After performance of flash etch seed layer operation 132, shielded embedded electronic component substrate 200 includes die shield lid 868 and upper buildup circuit pattern 866 as illustrated in FIGS. 9 and 10.

Die shield lid 868 includes a die shield plate 970 and one or more die shield vias 972. Die shield plate 970 is a flat plate on upper surface 756U of upper buildup dielectric layer 756. Die shield plate 970 is rectangular, e.g., square, in accordance with this embodiment as illustrated in FIG. 10, although is formed having other shapes in other embodiments.

Die shield plate 970 is formed directly above electronic component 644. To illustrate, referring to FIG. 10, the periphery of active surface 646 corresponding to sides 650 of electronic component 644 is indicated by the dashed rectangle. Electronic component 644 is represented as the dashed rectangle as electronic component 644 otherwise would not appear in the view of FIG. 10.

Further, die shield plate 970 is electrically connected to die shield flange 436 of die shield 428 by die shield vias 972. Die shield vias 972 are represented as dashed circles in FIG. 10 as die shield vias 972 otherwise would not appear in the view of FIG. 10. Although only two die shield vias 972 are illustrated, in light of this disclosure, those of skill in the art will understand that more or less than two die shield vias 972 are formed in other embodiments.

Accordingly, die shield 428 and die shield lid 868 form an electrically conductive shield structure 978 around electronic component 644 thus reducing noise. More particularly, electronic component 644 is shielded from below by die shield base 432. Electronic component 644 is shielded from the sides by dies shield sidewalls 434. Electronic component 644 is shielded from above by die shield plate 970.

Generally, shield structure 978 forms a faraday cage around electronic component 644, i.e., shields electronic component 644. Shielding is the blocking of electromagnetic radiation, i.e., emanating from electronic component 644 as well as received by electronic component 644. For example, electronic component 644 is shielded from lower circuit pattern 204, upper circuit pattern 430 and upper buildup circuit pattern 866 by shield structure 978.

Further, shield structure 978 also maximizes heat transfer from electronic component 644. More particularly, heat generated by electronic component 644 is dissipated to die shield 428, from die shield 428 to die shield vias 972, from die shield vias 972 to die shield plate 970, and from die shield plate 970 to the ambient environment. Accordingly, shielded embedded electronic component substrate 200 is well suited for use when electronic component 644 generates a significant amount of heat, e.g., in high power applications.

To allow electrical signals to be provided to/from bond pads 652 of electronic component 644, upper buildup circuit pattern 866 includes bond pad vias 980. Bond pad vias 980 are electrically connected to bond pads 652 and electrically isolated from the die shield plate 970 and, more generally, from shield structure 978. Although only two bond pad vias 980 are illustrated, in light of this disclosure, those of skill in the art will understand that more or less than two bond pad vias 980 are formed in other embodiments depending upon the particular input/output of electronic component 644, e.g., depending upon the number of bond pads 652.

In accordance with this embodiment, an annular space 982 exists between and electrically isolates bond pad vias 980 from die shield plate 970 as clearly illustrated in FIG. 10 allowing bond pad vias 980 to extend through die shield plate 970. Although annular space 982 is illustrated, in light of this disclosure, those of skill in the art will understand that the space between bond pad vias 980 and die shield plate 970 can assume any one of a number of shapes, and the particular shape is not essential. In one embodiment, the upper surfaces of bond pad vias 980 form lands 986.

Upper buildup circuit pattern 866 further includes electrically conductive vias 984 formed within via apertures 758 and electrically connected to lands 442 of upper circuit pattern 430. Upper buildup circuit pattern 866 further includes traces and/or lands 986 on upper surface 756U of upper buildup dielectric layer 756. In one embodiment, the upper surface of a via 984 forms a land 986. In another embodiment, a land 986 is formed on upper surface 756U of upper buildup dielectric layer 756 and spaced apart from vias 984 and electrically connected to vias 984 by traces of upper buildup circuit pattern 866.

Figure 11:
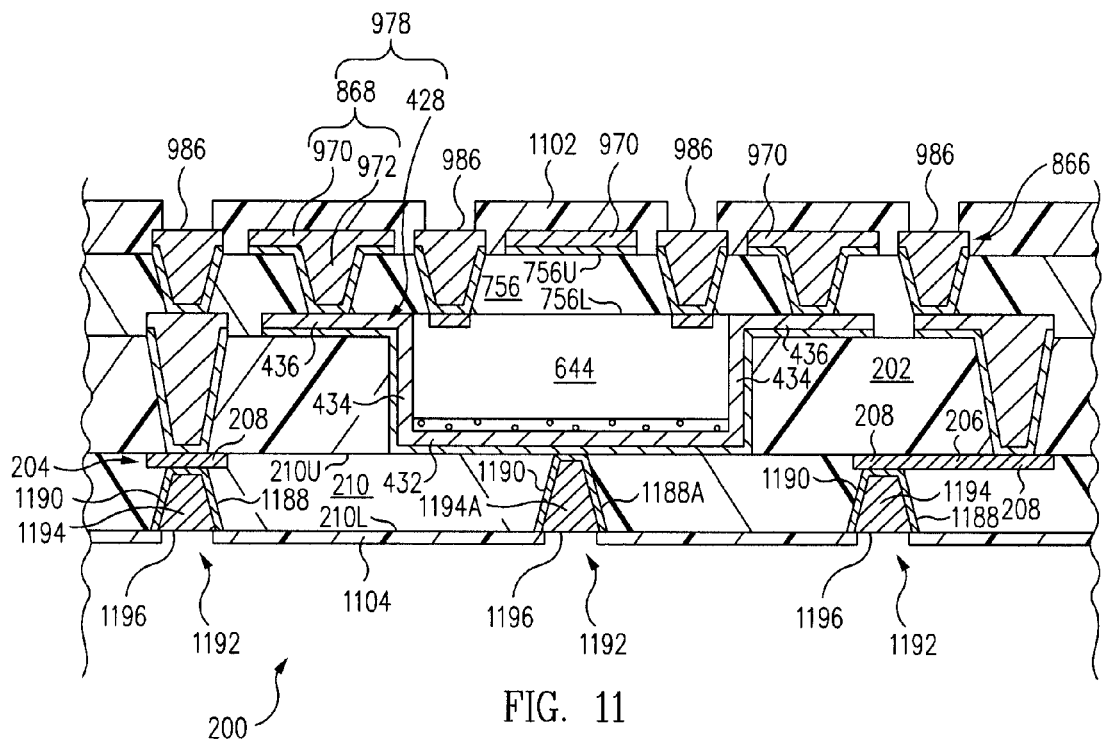
FIGS. 11, 12 are cross-sectional views of the shielded embedded electronic component substrate of FIG. 9 at further stages during fabrication in accordance with various embodiments.

FIG. 11 is a cross-sectional view of shielded embedded electronic component substrate 200 of FIG. 9 at a further stage during fabrication in accordance with one embodiment. Referring now to FIGS. 1 and 11 together, from flash etch seed layer operation 132, flow returns to form via apertures operation 120 as indicated by the arrow to the left. In accordance with this embodiment, operations 120-132 are repeated to form a lower buildup circuit pattern in lower buildup dielectric layer 210. The repeated operations 120-132 are similar or identical to operations 120-132 as described above and so are only briefly described below.

In form via apertures operation 120, via apertures 1188 are formed in lower buildup dielectric layer 210. Via apertures 1188 expose lower circuit pattern 204, e.g., lands 208 thereof, on lower surface 202L of core dielectric layer 202. Optionally, via apertures 1188 include one or more backside die shield via apertures 1188A that expose die shield base 432 of shield structure 978.

From form via apertures operation 120, flow moves to form seed layer operation 122. In form seed layer operation 122, a seed layer 1190 is blanket formed to cover lower surface 210U of lower buildup dielectric layer 210 and via apertures 1188. From form seed layer operation 122, flow moves to apply resist operation 124.

In apply resist operation 124, a resist is applied to lower buildup dielectric layer 210. From apply resist operation 124, flow moves to pattern resist operation 126. In pattern resist operation 126, the resist applied in apply resist operation 124 is patterned to form a buildup circuit pattern artifact therein. The buildup circuit pattern artifact is a patterned opening extending entirely through the resist and exposing a positive image of the lower buildup circuit pattern to be formed. Although not illustrated in FIG. 11 for simplicity, the resist is applied and patterned in operations 124, 126, in a manner similar to the application and patterning of resist 762 as illustrated in FIG. 7.

From pattern resist operation 126, flow moves to plate buildup circuit pattern (and optionally die shield lid) operation 128. In plate buildup circuit pattern (and optionally die shield lid) operation 128, a lower buildup circuit pattern 1192 is plated (a die shield lid is not plated at this stage during fabrication). Illustratively, lower buildup circuit pattern 1192 includes vias 1194 within via apertures 1188. Vias 1194 are electrically connected to circuit pattern 204, e.g., lands 208 thereof, on lower surface 202L of core dielectric layer 202.

Optionally, lower buildup circuit pattern 1192 includes at least one backside die shield via 1194A within backside die shield via aperture 1188A. Backside die shield via 1194A is electrically connected to die shield base 432 of shield structure 978 though lower buildup dielectric layer 210. Accordingly, backside die shield via 1194A allows a reference voltage source, e.g., ground or power, to be electrically connected to shield structure 978 from the lower surface of shielded embedded electronic component substrate 200. Formation of backside die shield via 1194A is optional, and in one embodiment, backside die shield via 1194A is not formed.

Lower buildup circuit pattern 1192 further includes traces and/or lands 1196 on lower surface 210L of lower buildup dielectric layer 210 in one embodiment. In one embodiment, the lower surfaces of vias 1194, 1194A forms lands 1196. In another embodiment, a land 1196 is formed on lower surface 210L of lower buildup dielectric layer 210 and spaced apart from vias 1194, 1194A and electrically connected to vias 1194, 1194A by traces of lower buildup circuit pattern 1192.

From plate buildup circuit pattern (and optionally die shield lid) operation 128, flow moves to strip resist operation 130. In strip resist operation 130, the resist applied and patterned in operations 124, 126 is stripped.

From strip resist operation 130, flow moves to flash etch seed layer operation 132. In flash etch seed layer operation 132, the portions of seed layer 1190 exposed upon stripping of the resist are flash etched and removed.

From flash etch seed layer operation 132, flow moves to an apply solder masks operation 134. In apply solder masks operation 134, upper and lower solder masks 1102, 1104 are applied and patterned to expose lands 986, 1196 of upper and lower buildup circuit patterns 866, 1192, respectively. Upper solder mask 1102 is applied to upper surface 756U of upper buildup dielectric layer 756. Similarly, lower solder mask 1104 is applied to lower surface 210L of lower buildup dielectric layer 210. Upper and lower solder masks 1102, 1104, i.e., dielectric materials, protect upper and lower buildup circuit patterns 866, 1192, and die shield plate 970, while exposing lands 986, 1196.

Figure 12:
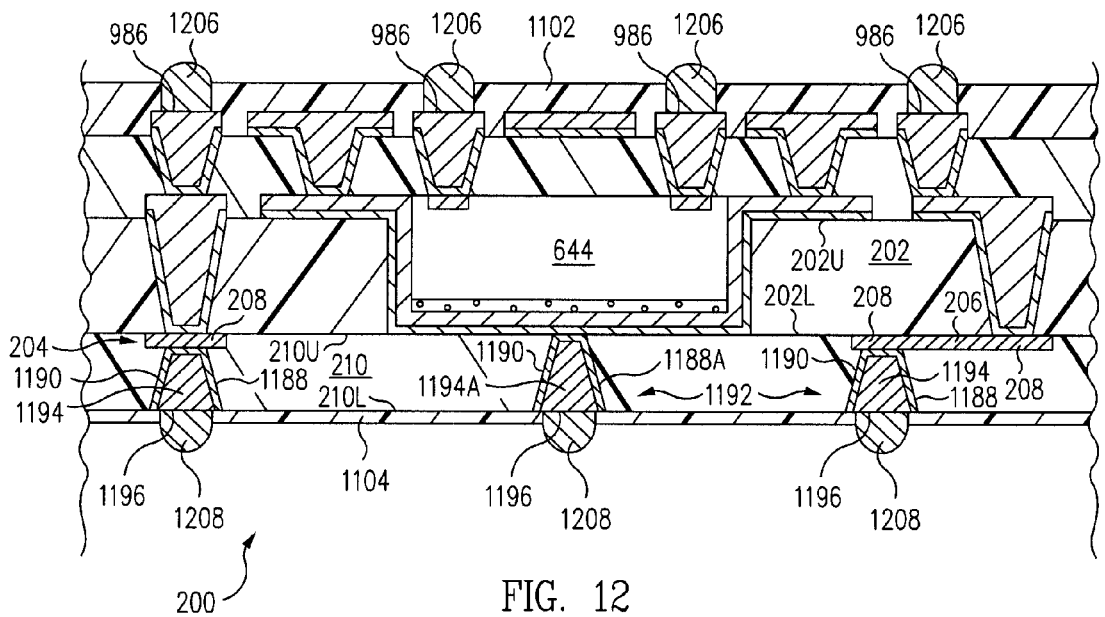

FIG. 12 is a cross-sectional view of shielded embedded electronic component substrate 200 of FIG. 11 at a further stage during fabrication in accordance with one embodiment. Referring now to FIGS. 1 and 12 together, from apply solder masks operation 134, flow moves, optionally, to a form interconnection balls operation 136. In form interconnection balls operation 136, upper and lower interconnection balls 1206, 1208 are formed on lands 986, 1196, respectively. Upper and lower interconnection balls 1206, 1208, e.g., solder, are arranged is a ball grid array (BGA) in one embodiment.

Upper and/or lower interconnection balls 1206 or 1208 are reflowed to mount shielded embedded electronic component substrate 200 to other structures such as a printed circuit motherboard in one embodiment. Further, upper and/or lower interconnection balls 1206 or 1208 are reflowed to mount (stack) additional electronic devices such as integrated circuit dies, other active components, passive components, electronic component packages, or other electronic devices on shielded embedded electronic component substrate 200.

In one embodiment, only upper interconnection balls 1206 or lower interconnection balls 1208 are formed in form interconnection balls operation 136. In another embodiment, interconnection balls operation 136 is not performed and so is an optional operation.

Figure 13:
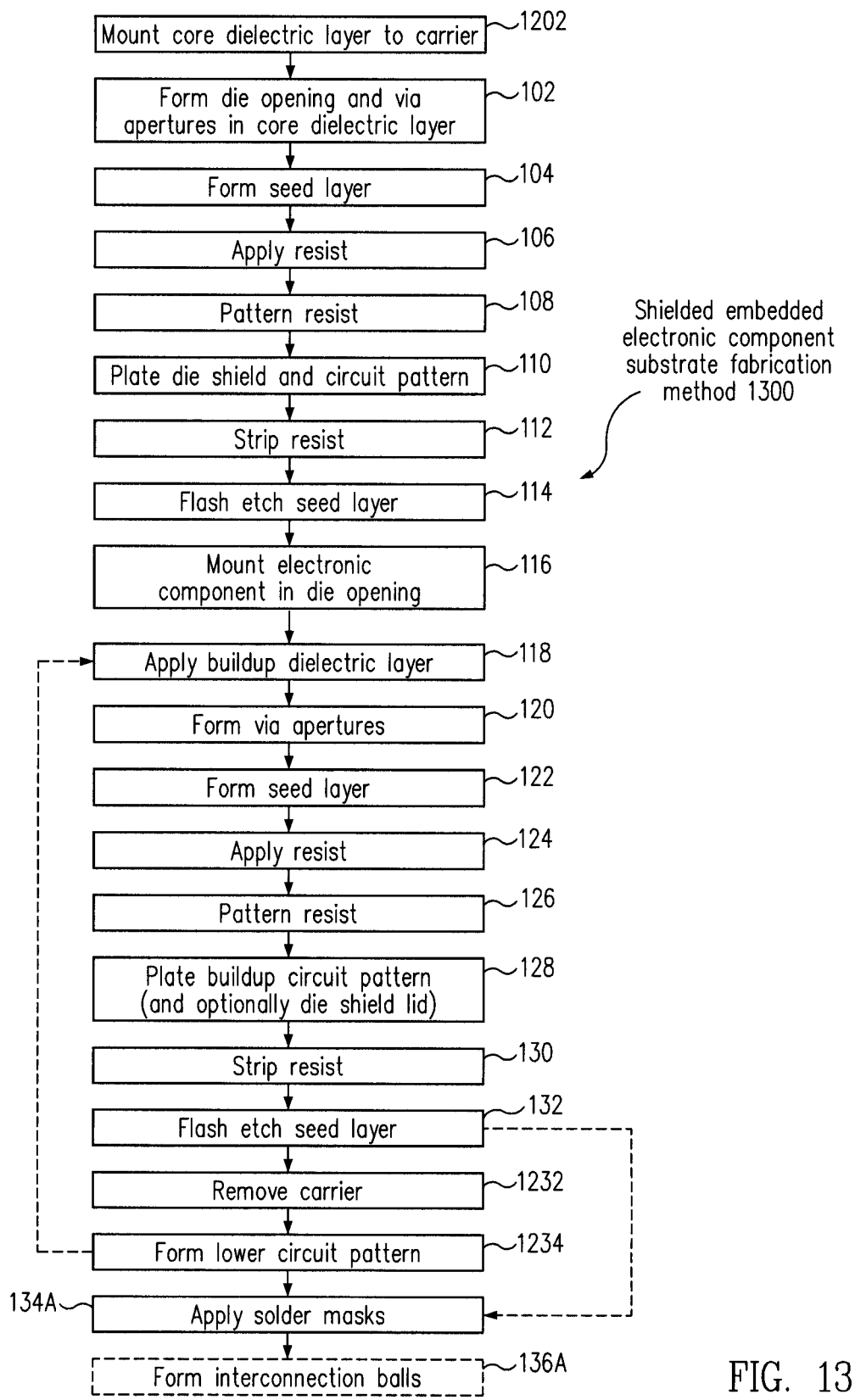
FIG. 13 is a shielded embedded electronic component substrate fabrication method in accordance with another embodiment.
Figure 14:
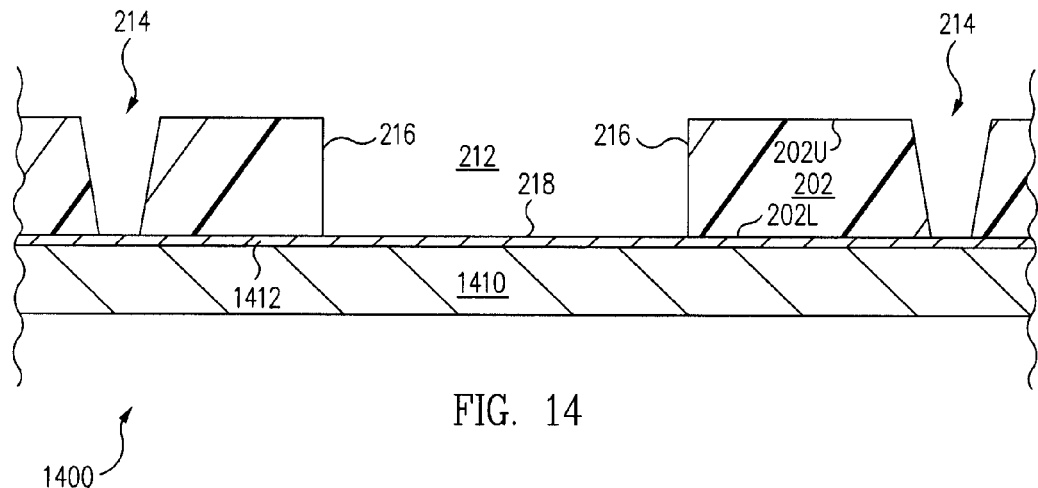
FIG. 14 is a cross-sectional view of a shielded embedded electronic component substrate during fabrication in accordance with one embodiment.

FIG. 13 is a shielded embedded electronic component substrate fabrication method 1300 in accordance with another embodiment. FIG. 14 is a cross-sectional view of a shielded embedded electronic component substrate 1400 during fabrication in accordance with one embodiment.

Referring now to FIGS. 13 and 14 together, in a mount core dielectric layer to carrier operations 1202, lower surface 202L of core dielectric layer 202 is mounted to a carrier 1410. In one embodiment, carrier 1410 is a rigid carrier, e.g., formed of copper. In this event, carrier 1410 is well-suited for supporting core dielectric layer 202 during processing, e.g., when core dielectric layer 202 is a relatively flexible film or other flexible dielectric.

Further, in accordance with this embodiment, core dielectric layer 202 includes a circuit pattern metal sheet 1412 of circuit pattern metal, e.g., a copper foil, on lower surface 202L of core dielectric layer 202. In this embodiment, carrier 1410 includes a release layer allowing carrier 1410 to be removed by peeling as discussed further below. In another embodiment, circuit pattern metal sheet 1412 includes an etch stop layer that allows carrier 1410 to be etch removed without removal of circuit pattern metal sheet 1412. In another embodiment, core dielectric layer 202 does not include circuit pattern metal sheet 1412.

Figure 15:
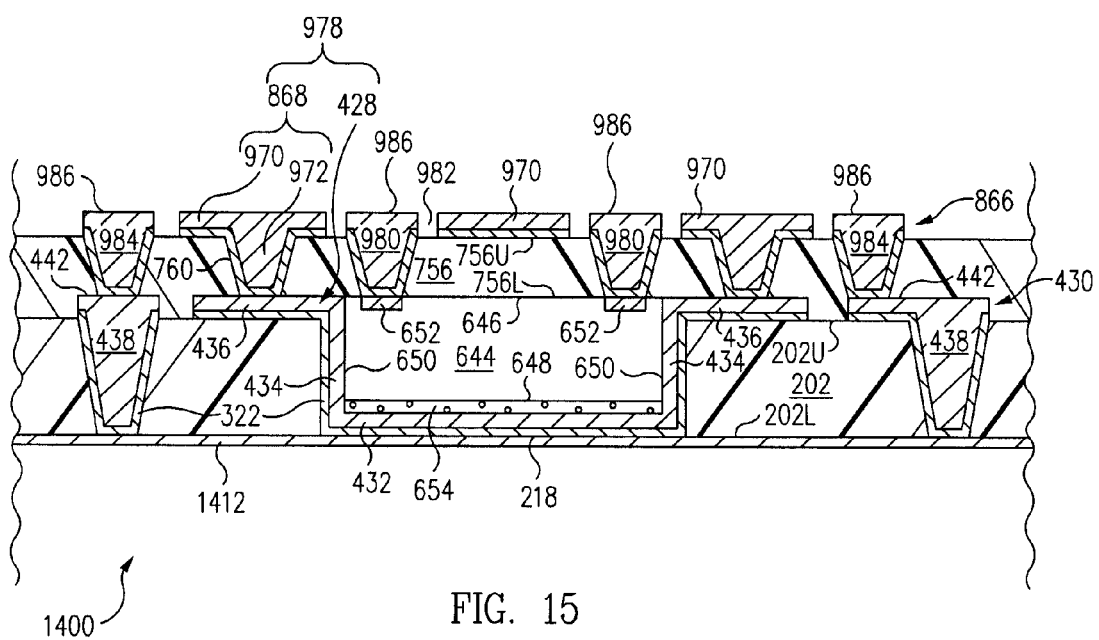
FIGS. 15, 16 are cross-sectional views of the shielded embedded electronic component substrate of FIG. 14 at further stages during fabrication in accordance with various embodiments.

FIG. 15 is a cross-sectional view of a shielded embedded electronic component substrate 1400 of FIG. 14 at a further stage during fabrication in accordance with one embodiment. Referring now to FIGS. 13, 14 and 15 together, operations 102, 104, 106, 108, 110, 112, 114, 116, 118, 120, 122, 124, 126, 128, 130, 132 are performed as discussed above in reference to FIG. 1. In accordance with this embodiment, die opening base 218 is the exposed region of circuit pattern metal sheet 1412 or carrier 1410 depending upon whether circuit pattern metal sheet 1412 is formed or not.

From flash etch seed layer operation 132, flow moves to a remove carrier operation 1232. In remove carrier operation 1232, carrier 1410 (FIG. 14) is removed thus exposing circuit pattern metal sheet 1412 as illustrated in FIG. 15. In various embodiments, carrier 1410 is removed by peeling, etching, grinding, or other removal technique.

Figure 16:
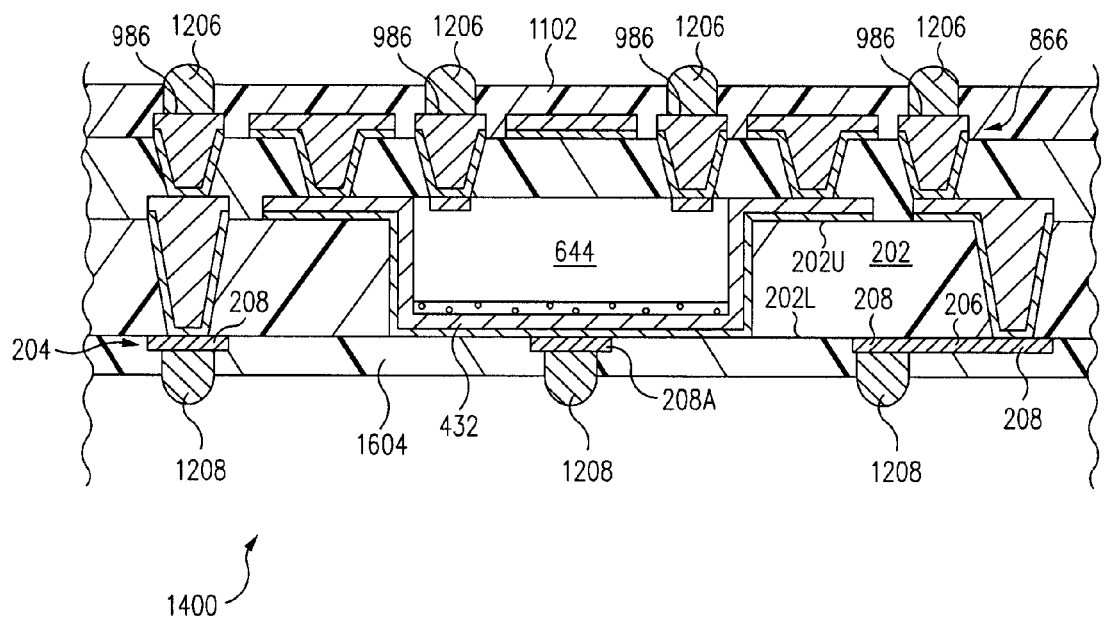

FIG. 16 is a cross-sectional view of a shielded embedded electronic component substrate 1400 of FIG. 15 at a further stage during fabrication in accordance with one embodiment. Referring now to FIGS. 13, 15 and 16 together, from remove carrier operation 1232, flow moves to a form lower circuit pattern operation 1234. In form lower circuit pattern operation 1234, circuit pattern metal sheet 1412 (FIG. 15) is patterned into lower circuit pattern 204 as illustrated in FIG. 16. Circuit pattern metal sheet 1412 is patterned using any one of a number of techniques, using laser-ablation, selective etching, or other patterning technique. In accordance with this embodiment, lower circuit pattern 204 includes a backside die shield land 208A electrically connected to die shield base 432.

Referring now to FIGS. 13 and 16 together, from form lower circuit pattern operation 1234, flow moves to apply solder masks operation 134A. In apply solder masks operation 134A, upper and lower solder masks 1102, 1604 are applied and patterned to expose lands 986 of upper buildup circuit pattern 866 and lands 208 of lower circuit pattern 204, respectively. Upper solder mask 1102 is applied to upper surface 756U of upper buildup dielectric layer 756. Similarly, lower solder mask 1604 is applied to lower surface 202L of core dielectric layer 202.

From apply solder masks operation 134A, flow moves to form interconnection balls operation 136A. In form interconnection balls operation 136A, upper and lower interconnection balls 1206, 1208 are formed on lands 986, 208, respectively. Upper and lower interconnection balls 1206, 1208, e.g., solder, are arranged is a ball grid array (BGA) in one embodiment.

In one embodiment, only upper interconnection balls 1206 or lower interconnection balls 1208 are formed in form interconnection balls operation 136A. In another embodiment, interconnection balls operation 136A is not performed and so is an optional operation.

In yet another embodiment, shielded embedded electronic component substrate 200 as illustrated in FIG. 12 is fabricated using shielded embedded electronic component substrate fabrication method 1300 of FIG. 13. In accordance with this embodiment, from the stage of fabrication illustrated in FIG. 15, referring now to FIGS. 12, 13, and 15 together, and returning to form lower circuit pattern operation 1234, flow moves from form lower circuit pattern operation 1234 to apply buildup dielectric layer operation 118 as indicated by the dashed arrow at the left. In accordance with this embodiment, referring now to FIG. 12, upper surface 210U of lower buildup dielectric layer 210 is applied to lower circuit pattern 204 and lower surface 202L of core dielectric layer 202.

Operations 120, 122, 124, 126, 128, 130, 132 are performed as discussed above in reference to FIGS. 1, 11 to form via apertures 1188, 1188A, seed layer 1190, lower buildup circuit pattern 1192, vias 1194, 1194A, and lands 1196 as illustrated in FIG. 12.

In accordance with this embodiment, from flash etch seed layer 132, flow moves to apply solder masks operation 134A as indicated by the dashed arrow at the right. In apply solder masks operation 134A, upper and lower solder masks 1102, 1104 are applied as illustrated in FIG. 12. Optionally, form interconnection balls operation 136A is performed to form upper and/or lower interconnection balls 1206, 1208 as illustrated in FIG. 12. Accordingly, shielded embedded electronic component substrate fabrication method 1300 of FIG. 13 is used to form shielded embedded electronic component substrate 200 of FIG. 12 in accordance with this embodiment.

Although formation of individual packages is described above, in other embodiments, a plurality of packages are formed simultaneously in an array using the methods as described above. The array is singulated to singulate the individual packages from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A shielded embedded electronic component substrate comprising:
   a core dielectric layer comprising a die opening;
   an electrically conductive die shield lining the die opening;
   an electronic component mounted within the die opening and to the die shield, wherein the die shield shields the electronic component;
   an upper buildup dielectric layer having a lower surface applied to an active surface of the electronic component;
   an electrically conductive die shield lid formed on an upper surface of the upper buildup dielectric layer, the die shield lid being formed directly above the electronic component;
   bond pad vias electrically connected to bond pads on the active surface of the electronic component, the bond pad vias extending through the die shield lid and being electrically isolated from the die shield lid; and
   a dielectric solder mask applied to the upper surface of the upper buildup dielectric layer and the die shield lid.

2. The shielded embedded electronic component substrate of claim 1 wherein the bond pad vias extend through the upper buildup dielectric layer.

3. The shielded embedded electronic component substrate of claim 1 wherein the bond pad vias are separated from the die shield lid by annular spaces.

4. The shielded embedded electronic component substrate of claim 1 wherein the die shield comprises:
   a die shield base on a die opening base of said die opening;
   die shield sidewalls on die opening sidewalls of said die opening; and
   a die shield flange on an upper surface of the core dielectric layer.

5. The shielded embedded electronic component substrate of claim 4 further comprising an adhesive mounting an inactive surface of the electronic component to the die shield base.

6. The shielded embedded electronic component substrate of claim 1 further comprising die shield vias extending through the upper buildup dielectric layer and electrically connecting the die shield lid to the die shield.

7. The shielded embedded electronic component substrate of claim 6 wherein a shield structure comprises the die shield and the die shield lid.

8. The shielded embedded electronic component substrate of claim 1 further comprising a lower circuit pattern on a lower surface of the core dielectric layer.

9. The shielded embedded electronic component substrate of claim 8 wherein the lower circuit pattern comprises a backside die shield land electrically connected to the die shield.

10. The shielded embedded electronic component substrate of claim 8 further comprising a lower buildup dielectric layer having an upper surface applied to the lower surface of the core dielectric layer; and
    a backside die shield via extending through the lower buildup dielectric layer and electrically connected to the die shield.

11. A method of fabricating a shielded embedded electronic component substrate comprising:
    forming a die opening in a core dielectric layer;
    lining the die opening with an electrically conductive die shield;
    mounting an electronic component within the die opening and to the die shield;
    shielding the electronic component with the die shield;
    applying a lower surface of an upper buildup dielectric layer to an active surface of the electronic component;
    forming an electrically conductive die shield lid on an upper surface of the upper buildup dielectric layer, the die shield lid being formed directly above the electronic component;
    forming bond pad vias electrically connected to bond pads on the active surface of the electronic component, the bond pad vias extending through the die shield lid and being electrically isolated from the die shield lid; and
    applying a dielectric solder mask to the upper surface of the upper buildup dielectric layer and the die shield lid.

12. The method of claim 11 wherein the mounting comprises mounting an inactive surface of the electronic component to a die shield base of the die shield.

13. The method of claim 11 further comprising electrically connecting the die shield lid to the die shield.

14. The method of claim 11 further comprising:
    mounting the core dielectric layer to a carrier; and
    removing the carrier.

15. The method of claim 14 further comprising forming a lower circuit pattern on a lower surface of the core dielectric layer.

16. The method of claim 15 wherein the lower circuit pattern is formed from a circuit pattern metal sheet on the lower surface of the core dielectric layer.

* * * * *